United States Patent [19]
Wong et al.

[11] Patent Number: 5,272,392
[45] Date of Patent: Dec. 21, 1993

[54] CURRENT LIMITED POWER SEMICONDUCTOR DEVICE

[75] Inventors: Stephen L. Wong, Scarsdale; Sreeraman Venkitasubrahmanian, Ossining, both of N.Y.

[73] Assignee: North American Philips Corporation, New York, N.Y.

[21] Appl. No.: 987,892

[22] Filed: Dec. 4, 1992

[51] Int. Cl.$^5$ .......................... H03K 3/01; H03K 3/26
[52] U.S. Cl. .................................. 307/270; 307/299.2; 307/546; 307/310; 307/318; 307/491; 361/91; 361/93; 361/100; 361/101
[58] Field of Search .................... 307/299.2, 270, 546, 307/320, 318, 491; 361/91, 93, 100.1

[56] References Cited

U.S. PATENT DOCUMENTS 5,061,863 10/1991 Mori et al. ........................ 307/299.2
5,184,272 2/1993 Suda et al. .......................... 361/100

Primary Examiner—Margaret R. Wambach
Attorney, Agent, or Firm—Bernard Franzblau

[57] ABSTRACT

A current limit circuit for protection of an intelligent power switch includes a series circuit of a sense transistor and a sense resistor coupled to the power semiconductor transistor switch so that the sense resistor current is a fraction of, and is proportional to, the power transistor current. A pull-down transistor is coupled to the control electrode of the power transistor switch. A feedback circuit including a series connection of a diode-connected transistor and a reference V source is coupled between the sense resistor and the control electrode of the pull down transistor. The feedback circuit produces a voltage level shift and the circuit provides an accurate limit on the power transistor current independent of any variations in threshold voltage.

16 Claims, 6 Drawing Sheets

CURRENT LIMITED POWER SEMICONDUCTOR DEVICE

BACKGROUND OF THE INVENTION

This invention relates to a current limit circuit for providing automatic protection of a power transistor or the like from damage caused by excessive current flowing therein as a result of an overload condition, such as a short-circuit at the load. More particularly, the invention relates to a current limit circuit adapted to protect the power semiconductor device in a so-called "high side" Intelligent Power Switch (IPS or "smart power" switch).

A "smart power" device or intelligent power switch is an integrated circuit in which control functions are provided by low voltage logic devices integrated along side of power semiconductor devices, such as power MOSFETs, together on a common chip. It is customary in known high side power chips to isolate the integrated low power components from the high power components on the chip by the provision of special diffusions or barrier layers of differing conductivity types or by the provision of dielectric layers.

The invention is particularly useful in automotive applications, but is not limited to this field of technology. In recent years there has been a dramatic increase in the use of semiconductor electronic systems in the automobile, such as in ignition/fuel control, switches for headlamps, monitoring of emissions and braking systems. All of these control functions require safe and reliable semiconductor devices for monitoring, logic and power control. A key component for these various automotive applications is an inexpensive and reliable intelligent power switch (IPS) that is able to drive high current loads (for example, up to 10 A) such as headlights, solenoids and small electric motors. The IPS must be able to withstand a supply voltage of up to 60 volts and at the same time provide self protection against short circuits and excessive temperatures.

A typical IPS device in an automotive electronics system requires an integrated circuit chip which combines 60 volt power components and both low voltage (5 V to 12 V) and high voltage (60 V–80 V) logic components. A typical chip must have the intelligence to protect the switch against various potentially destructive conditions such as a short circuit to ground, a reverse battery and voltage surges due to inductive loads. The intelligent power switch device should also provide thermal shut down, rail-to-rail current limiting and should detect open load and over voltage conditions and provide an indication of any overload condition. The provision of these supervisory and safety features is complicated because of the wide variation of supply voltages, for example, from approximately 6 V to 60 V, and the varied nature of the fault conditions which may occur.

A typical IPS chip consists of four main functional blocks, a gate control unit, a sensor block, a control logic and a power supply. In the case of a high side power switch, the gate control unit provides gate drive to the power switch by means of an oscillator/charge pump circuit. The sensor block contains voltage, current and temperature detectors in order to accurately monitor the condition of the intelligent power switch chip and the load. The control logic block diagnoses potential fault conditions and initiates the necessary corrective action. The power supply block contains precision analog circuits, such as a band-gap reference, so as to provide the necessary reference and bias voltages and currents for the chip. The total supply current flows to ground via a reverse-battery protection circuit.

Various techniques have been proposed for limiting the current through a power transistor. One known circuit for providing current limit protection for a high side intelligent power switch is shown in FIG. 1 of the drawing. In this circuit a power switch 1, for example a power MOSFET element, is connected in series with a load resistor 2 between one terminal of a battery and ground. A second series circuit consisting of a sense MOSFET 3 and a sense resistor ($R_S$) 4 is connected between the battery terminal and a junction point 5 between the power MOS switch 1 and the load 2. An NMOS FET 6 is connected between the gate of the power MOS transistor 1 and the junction point 5. The gate of pull-down transistor 6 is connected to a junction point between the field effect transistor 3 and the sense resistor 4. The gates of the field effect transistors 1 and 3 are connected in common to a gate drive input terminal 7. A serious disadvantage of this current limiting scheme is the fact that the current limit value is determined essentially by the threshold voltage of the NMOS transistor 6, which voltage is subject to a wide variation due to variations in the manufacturing process of the IPS chip. In addition, a typical value of the threshold voltage ($V_{th}$) is 1 V or more and this value produces too high a voltage drop across the sampling sense resistor 4 to provide accurate current mirroring between the field effect transistors 1 and 3.

A known variation of the FIG. 1 current limiting power switch circuit includes a comparator connected between the junction point of sense FET 3 and sense resistor 4 and the gate of the pull-down NMOS transistor 6. In this variation, a first input of the comparator is connected to the aforesaid junction point, a second input is connected to a source of reference voltage, and its output is connected to the gate of the NMOS field effect transistor 6. A compensation capacitor of the order of 100–150 pF is connected between the comparator output and the drain of the NMOS transistor 6 in order to provide stability. The compensation capacitor is required because the load capacitance to be driven and formed by the gate capacitance of the power MOSFET 1 is very large. This current limit circuit is therefore unattractive because of the chip area requirements and the stability problem.

SUMMARY OF THE INVENTION

It is an object of the present invention to provide a fast, stable and accurate current limit circuit for protecting a high side intelligent power switch and one that is not subject to the disadvantages of the known intelligent power switch current limit circuits.

A further object of the invention is to provide an intelligent power switch that is simple and reliable and is protected against current overload conditions.

In accordance with the present invention, a single stage feedback circuit is connected between the junction point of the sense MOS transistor and the sense resistor and the gate of the NMOS pull-down transistor. This feedback circuit includes a second NMOS transistor in series with a source of reference voltage and operates so as to shift the voltage level. As a result, a sense resistor of very low resistance value can be used in series with the sense MOS transistor, which in turn makes it possible for the power MOS switch transistor and the sense MOS transistor to effectively operate like a current mirror circuit, i.e. the current through the sense MOS transistor is proportional to the current through the power MOS transistor. This comes about because the voltage drop across the very small sense resistor is now negligible so that the power and sense transistors are effectively balanced even though the source voltage of the power switch transistor is not exactly equal to the source voltage of the sense transistor because the latter transistor source voltage is offset by the relatively small voltage drop across the sense resistor.

In one embodiment of the invention, the second NMOS transistor has its gate and drain directly connected together and via a bias current source to the high terminal of the battery. A reference resistor is connected between the gate of the first NMOS transistor and the gate of the second NMOS transistor and a reference current source is connected between the gate of the first NMOS transistor and the load. The current flow through the reference resistor produces a reference voltage thereacross. In order to obtain a stable value of reference voltage with temperature variations, a band gap reference voltage source can be used to derive the reference current. Since the reference voltage ($V_r$) is now well defined, we are able to produce an accurate current limit independent of threshold voltage variations.

In another embodiment of the invention, a Proportional To Absolute Temperature (PTAT) current source can be used as the reference current source. As a result, the reference voltage drop $V_r$ can decrease with an increase in temperature thereby to provide a current limit for the circuit which decreases with increasing temperature so as to better protect the semiconductor power switch.

In still another embodiment of the invention in which the current limit decreases as the temperature increases, instead of using a reference resistor, an NPN bipolar transistor is connected between the high battery terminal and the gate of the first NMOS transistor. The base of the bipolar transistor is connected to the gate of the second NMOS transistor. In this embodiment, the base/emitter voltage drop, $V_{BE}$, of the NPN bipolar transistor operates as the reference voltage, $V_r$, and decreases with temperature to provide a temperature dependent current limit operation similar to that of the PTAT current source in the above described embodiment.

A further embodiment of the invention provides a power limiting function for the circuit. In this embodiment, a zener diode and a current limit resistor are connected in series circuit between the high side terminal of the battery or other DC supply voltage and the gate of the second NMOS transistor (connected as a diode). In this power limiting circuit, the gate/source voltage ($V_{gs}$) of the second NMOS transistor is made to increase with the battery voltage. Since the limit value of $V_{gs}$ of the first NMOS transistor and the reference voltage ($V_r$) are fixed, the limit voltage ($V_{slim}$) across the sense resistor ($R_s$) decreases to maintain the equality of the voltage drops in the feedback loop. Thus, the current limit decreases as the battery (supply) voltage increases and thereby limits the total power dissipation of the circuit.

BRIEF DESCRIPTION OF THE DRAWINGS

A more complete understanding of the present invention and of the above described and other features and advantages thereof will become apparent from the following detailed description when read in connection with the accompanying drawing, in which.

DESCRIPTION OF THE PREFERRED EMBODIMENTS

Figure 1:
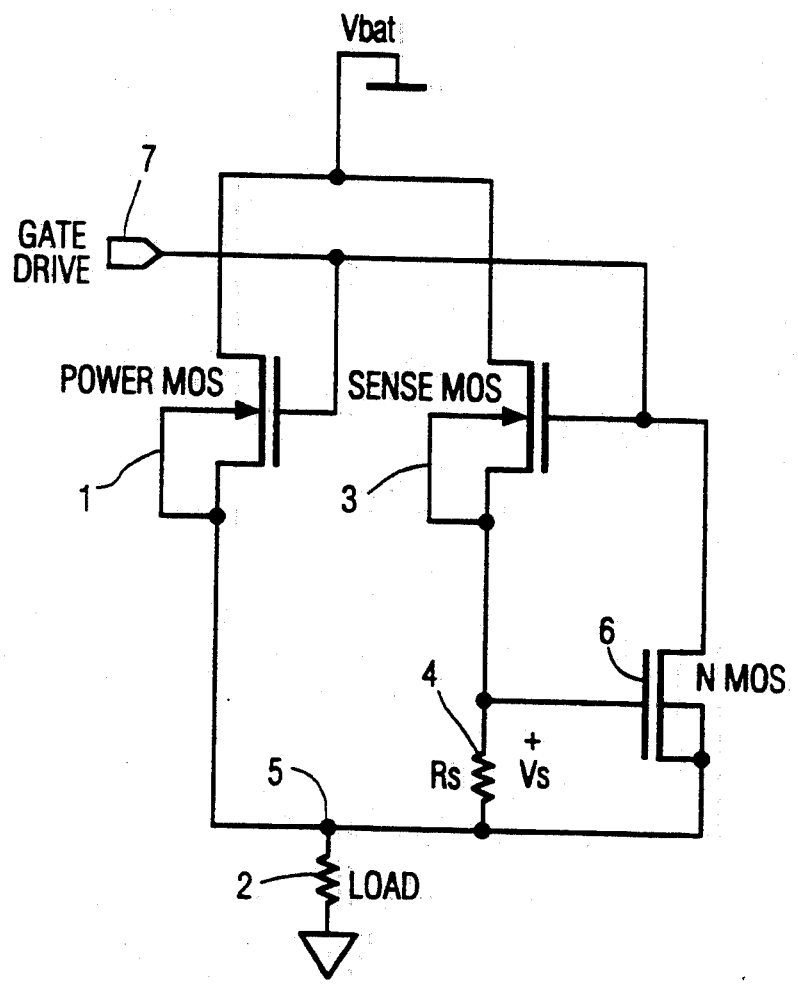
FIG. 1 shows a known current limit circuit.

In the various figures of the drawings, elements which are the same are provided with the same reference labels. The known current limit circuit of FIG. 1 has already been described above.

Figure 2:
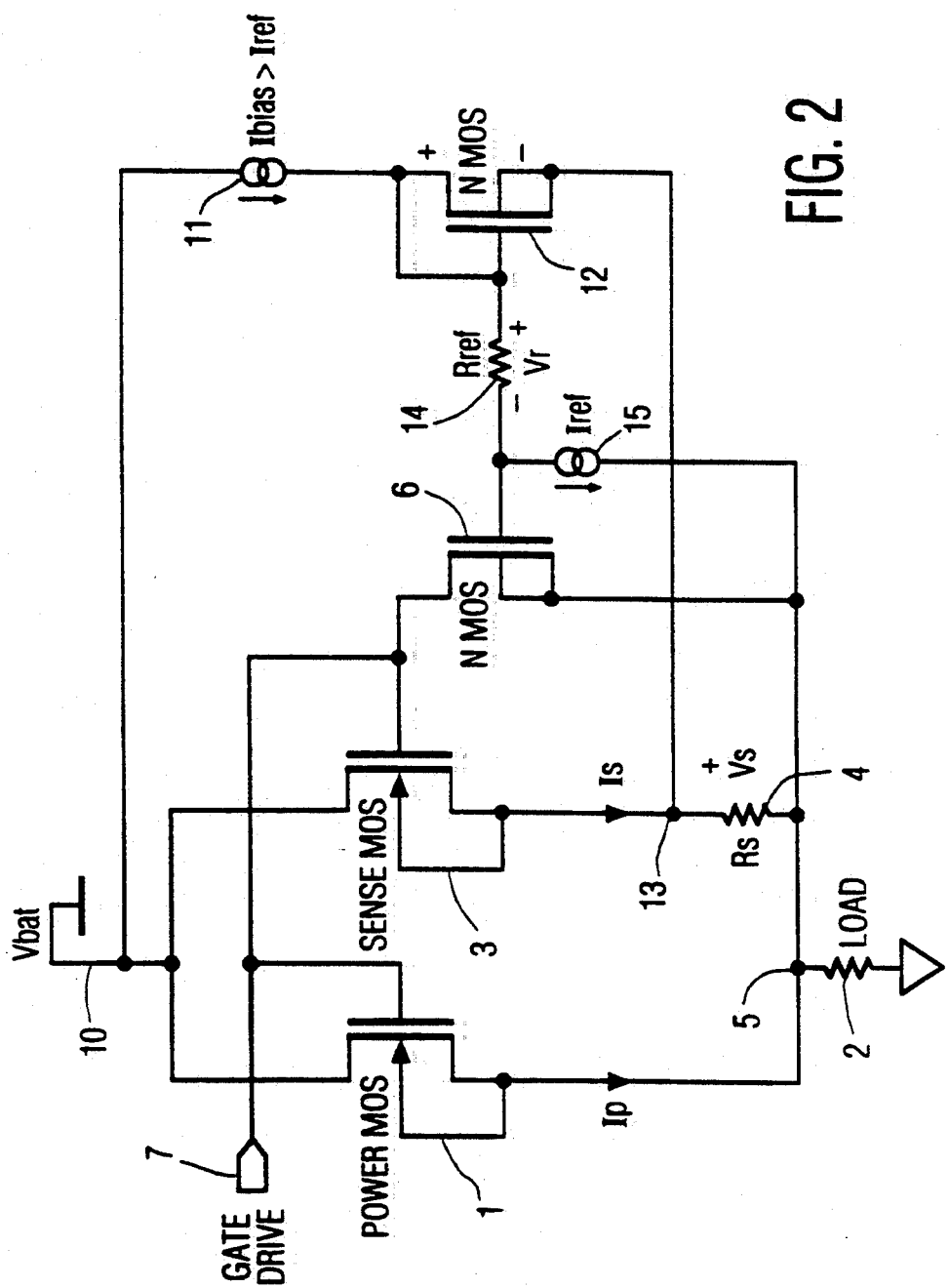
FIG. 2 shows a first embodiment of an intelligent power switch incorporating the current limit circuit of the invention.

FIG. 2 shows a first embodiment of a high side intelligent power switch containing the current limit feature of the present invention. A battery (not shown) has a first terminal connected to the battery voltage terminal 10 and a second terminal connected to a point of reference voltage, for example, ground. The high side switch, i.e. power MOSFET 1, and the load 2 are connected in a first series circuit between the battery voltage terminal 10 and ground, thus across the battery. The sense MOSFET 3, the sense resistor 4 and the load 2 are connected in a second series circuit between terminal 10 and ground. A circuit junction point 5 is present between sense resistor 4, load 2 and the source electrode of power MOS transistor 1.

A first NMOS transistor 6, i.e. a pull-down transistor, is connected between the input gate drive terminal 7 and the junction point 5. The gate electrodes of the MOS transistors 1 and 3 are connected in common to the gate drive terminal 7.

A bias current source 11 and a second NMOS transistor 12 are connected in a third series circuit between the supply voltage terminal 10 and a second circuit junction point 13 located between the source of the sense MOS transistor 3 and the top terminal of sense resistor 4. The drain of NMOS transistor 12 is directly connected to its gate and the gate of transistor 12 is connected via a reference resistor 14 ($R_{ref}$) to the gate of the pull-down MOSFET 6. The gate of the NMOS transistor 6 is connected to the circuit junction point 5 via a source of reference current 15 through which flows a reference current, $I_{ref}$. A reference voltage, $V_r$, is developed across resistor 14 which thus functions as a source of reference voltage.

In operation, the sense transistor is arranged to carry a fraction of the current flowing through the high side power switch transistor 1. As a result, the resistance $R_s$ of the sense resistor 4 can be chosen to have a low value so that the transistors 1 and 3 effectively function as a current mirror. Therefore, the voltage drop, $V_s$, across the sense resistor is proportional to the current, $V_p$, flowing through the power MOS transistor 1.

By means of the feedback circuit comprising the NMOS transistor 12 and the reference resistor 14, the voltage $V_s$ across the sense resistor 4 of resistance $R_s$ is shifted up in value by the gate/source voltage, $V_{gs}$ ($T_{r12}$) of transistor 12, and is then shifted down in value by a well defined reference voltage ($V_r$), developed across reference resistor 14 so as to derive the following gate-source voltage, $V_{gs}(T_{r6})$ of the pulldown transistor 6, $$V_{gs}(T_{r6}) = V_s + V_{gs}(T_{r12}) - V_r \qquad (1)$$

If the current flowing through the power MOSFET 1 increases, so does the current flow through the sense MOSFET 3, and if it increases to a value such that the voltage drop $V_s$ across the sense resistor 4 becomes equal to the reference voltage $V_r$ across the reference resistor 14, i.e. when $V_s = V_r$, then from equation (1) we get:

$$V_{gs}(T_{r6}) = V_{gs}(T_{r12}) \qquad (2)$$

The NMOS transistors 6 and 12 are located very close to one another on an integrated circuit chip so that the condition expressed in equation (2) is independent of threshold voltage ($V_{th}$) variations which occur in the fabrication process. Transistor 12 is biased so that $V_{gs}(T_{r12})$ is slightly above the threshold voltage ($V_{th}$) of an NMOS transistor. Thus, no current limiting occurs as long as $V_{gs}(T_{r6}) < V_{gs}(T_{r12})$.

As mentioned above, current limiting occurs when:

$$V_s = V_r \qquad (3)$$

At this point, $V_{gs}(T_{r6}) = V_{gs}(T_{r12})$ so that the gate to source voltage, $V_{gs}(T_{r6})$, of NMOS transistor 6 is sufficient to turn on the transistor 6 which in turn pulls down the gate voltage of the power MOS transistor 1. This prevents any further increase in the current flow through the power transistor 1.

Since the reference voltage ($V_r$) is a well defined reference voltage, which may also be generated by means of a band gap reference voltage, a very accurate current limit value is achieved which, at the same time, is independent of threshold voltage variations.

If N = (W/L of MOSFET 1)/(W/L of MOSFET 3), then the current limit value $I_p$ (limit) of power transistor 1 is given by:

$$I_p(\text{limit}) = V_r / R_s * N \qquad (4)$$

where $R_s$ is the resistance value of the sense resistor 4.

If both N and $R_s$ have fixed values, which is customary, then from equation (4) the current limit is directly controlled by the reference voltage, $V_r$.

The reference voltage, $V_r = I_{ref} * R_{ref}$, where $I_{ref}$ and $R_{ref}$ are the values of the reference current in the reference current source 15 and the resistance of the reference resistor 14, respectively.

In order to produce a very accurate reference voltage, the current $I_{ref}$ can be generated by means of a temperature stable bandgap voltage, $V_{bgap}$.

As an example, if $I_{ref} = 10 \mu A$ and $R_{ref} = 50K$, then $V_r = 0.5$ V. And if $R_s = 10 \Omega$ and N = 1000, then $I_p$ (limit) = 0.5/10*1000 = 50 A.

Figure 3:
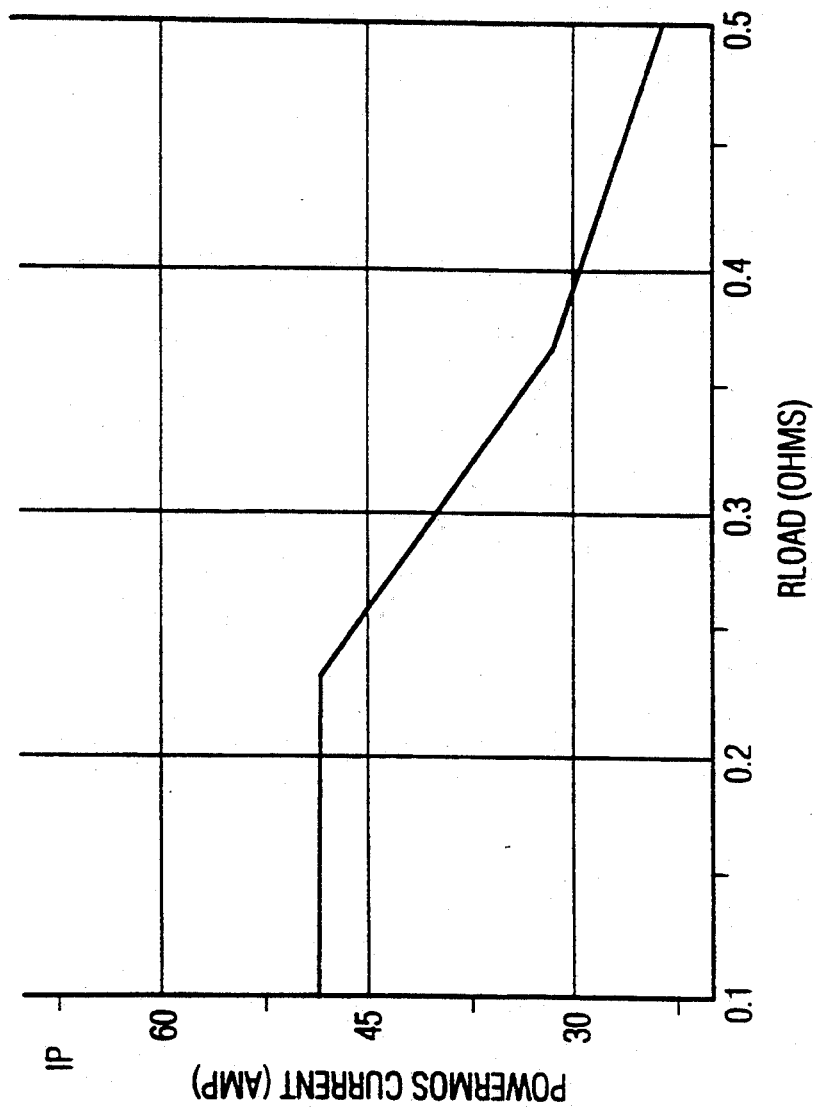
FIG. 3 is a diagram of load current versus load resistance that illustrates the current limiting feature of the circuit of FIG. 2.

FIG. 3 shows the relationship between the current ($I_p$), in the power MOSFET 1 in amps versus the load resistance $R_l$ in ohms for the current limit circuit of FIG. 2. As can be seen from this figure, the current $I_p$ increases up to a value of 50A as the load resistance decreases. The current $I_p$ is thereafter limited to the value 50A despite a further decrease in the load resistance.

In the current limit circuit of FIG. 2, the sense MOS transistor 3 carries a fraction of the current ($I_p$), of the power MOS transistor 1. As a result, the voltage $V_s$ across the sense resistor 4 is proportional to the current $I_p$. The sense voltage $V_s$ across the resistor 4 is voltage level shifted upwards by the NMOS transistor 12 and the reference voltage, $V_r$, is subtracted therefrom to derive the gate voltage of NMOS pull-down transistor 6. The voltage $V_{gs}(T_{r12})$ effectively offsets the threshold voltage ($V_{th}$) which makes it possible to keep the voltage $V_s$ as small as possible, thereby allowing the sense resistor current $I_s$ to maintain its proportionality to the power transistor current $I_p$.

During normal operation of the circuit, that is prior to any current limit action, $V_{gs}(T_{r12}) > V_{gs}(T_{r6})$ so that the pull-down transistor 6 is non-conductive. If the current $I_s$ flowing through sense resistor 4 increases to the point where $V_s = V_r$, $V_{gs}(T_{r6}) = V_{gs}(T_{r12})$ and the current limit operation commences as pull-down transistor 6 is turned on.

The current limit circuit thus provides an accurate current limit independent of any variation of threshold voltage by using a single stage feedback mechanism which is inherently very stable without the use of any compensation. If the resistance $R_s$ of the sense resistor 4 increases with temperature, then from the relationship (4) it is apparent that the limit current would decrease with an increase in temperature. A range of values can be chosen for $R_s$, $V_r$ and N so as to provide different current limit values.

Figure 4:
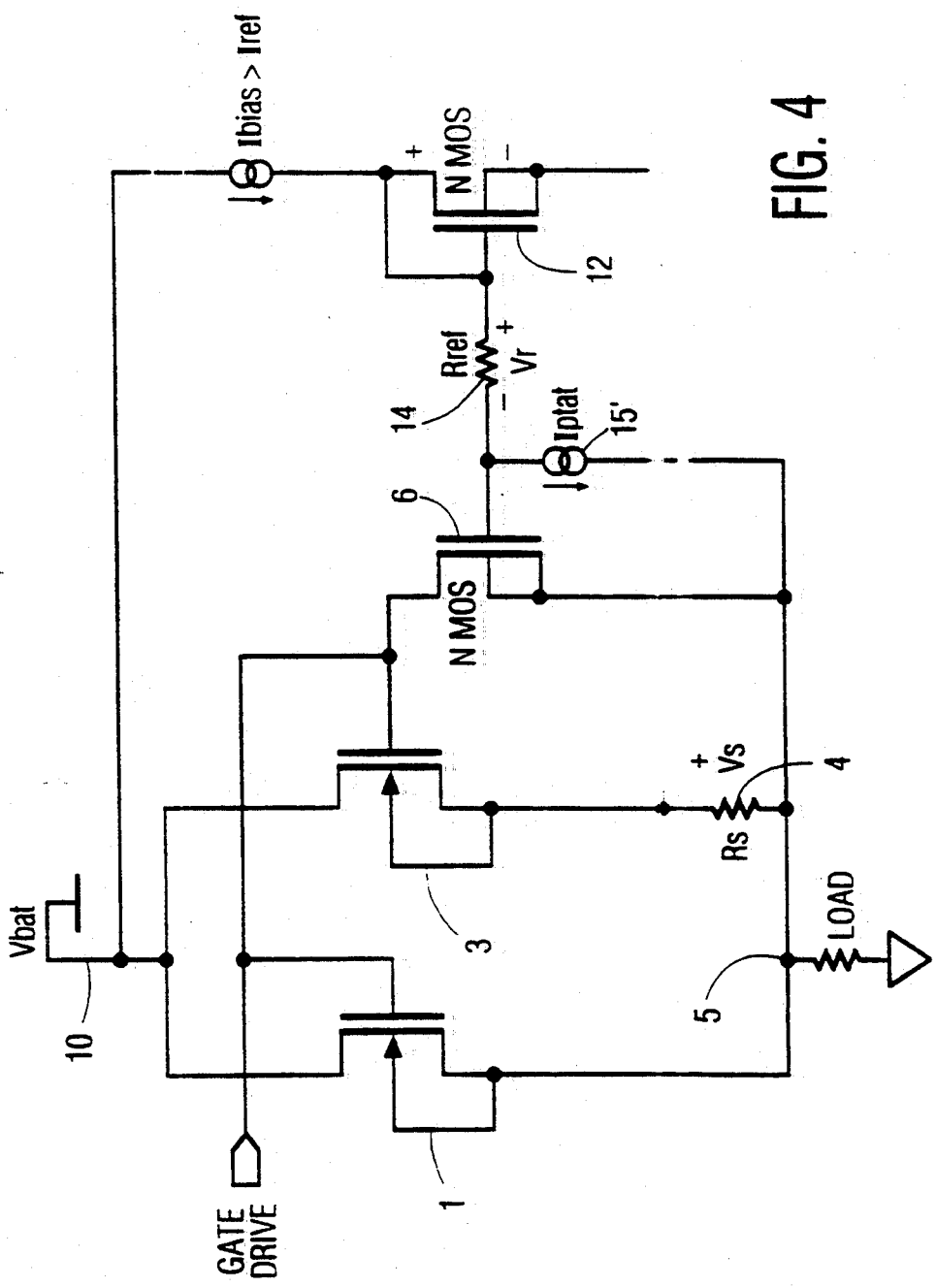
FIG. 4 shows a second embodiment of the invention in which the current limit decreases as the temperature increases.

FIG. 4 shows a modified current limit circuit which has the added feature that the current limit point decreases as the temperature increases thereby to better protect the power transistor 1. The circuit of FIG. 4 is the same as that of FIG. 2 except that the reference voltage, $V_r$, is made to decrease as the temperature increases. In the inverse temperature-dependent current limit circuit of FIG. 4, a proportional to absolute temperature (PTAT) current source 15' is substituted for the fixed reference current source 15 of FIG. 2. The PTAT current source produces a current ($I_{PTAT}$) which decreases as the temperature increases. The reference voltage, $V_r$, is thus, $V_r = I_{PTAT} * R_{ref}$.

As a result, the reference voltage ($V_r$) developed across the reference resistor 14 decreases with increasing temperature and thereby reduces the current limit value of $I_p$ in accordance with equation (4) above. The current limit circuit of FIG. 4 thus decreases the limiting current value as the temperature of the chip increases. This decrease is determined by the well controlled temperature dependence characteristic of the PTAT current source. The temperature responsive current limit circuit of FIG. 4 otherwise operates in a manner similar to that of the current limit circuit of FIG. 2.

Figure 5:
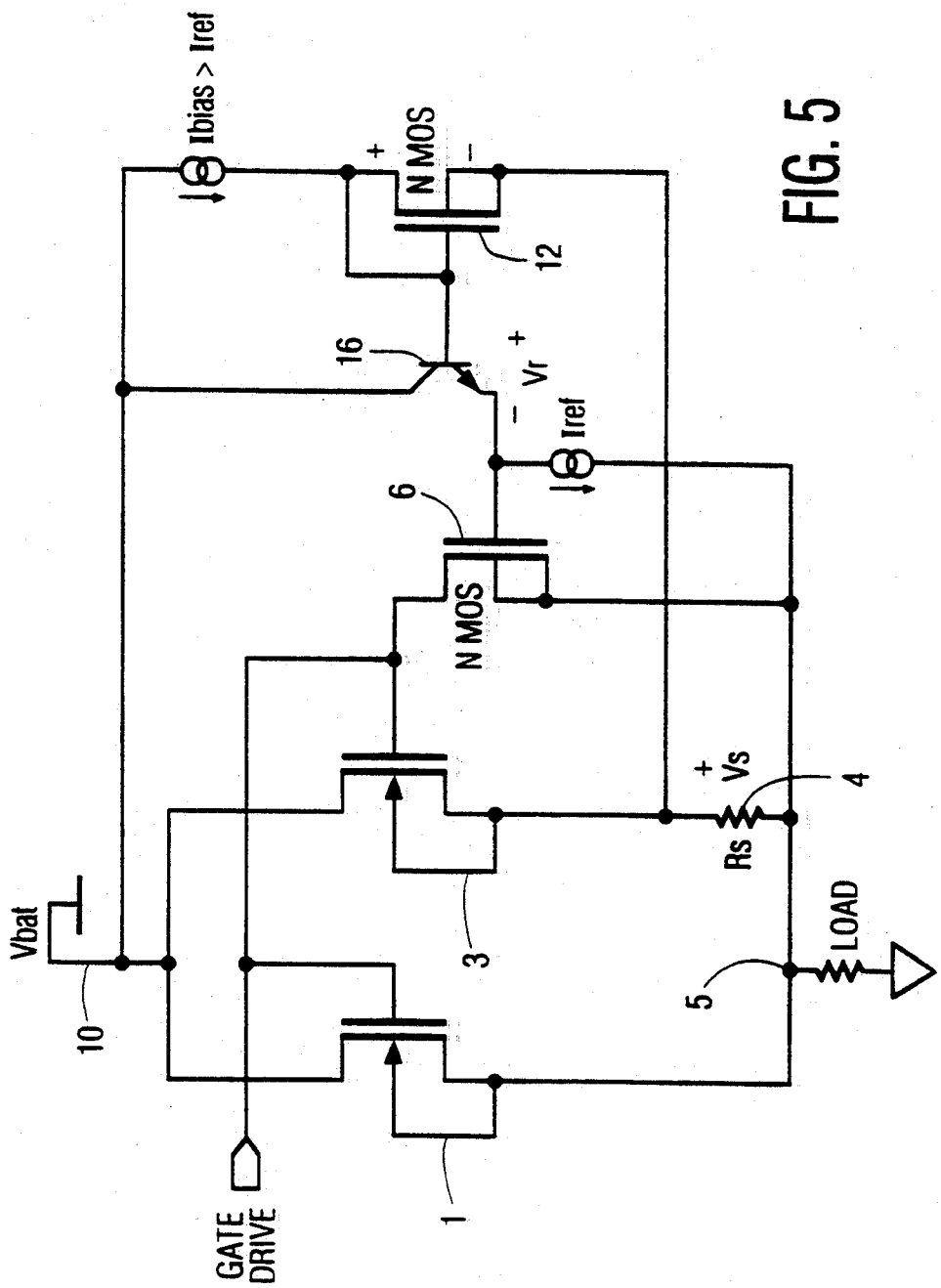
FIG. 5 shows a third embodiment of the invention in which the current limit again decreases as the temperature increases.

FIG. 5 shows still another current limit circuit in which the current limit value decreases with an increase in temperature and in a well controlled manner. The current limit circuit of FIG. 5 is also similar to that of FIG. 2, except that now the reference resistor 14 of FIG. 2 is replaced by an NPN bipolar transistor 16 having its collector connected to the supply voltage terminal 10, its emitter connected to the gate of the pull-down NMOS transistor 6 and its base connected to the gate of the NMOS transistor 12. In the circuit of FIG. 5, the reference voltage, $V_r$, is implemented by the base/emitter voltage drop, $V_{be}$, of the bipolar transistor 16. The $V_{be}$ voltage of the NPN transistor 16 decreases as the temperature increases. Thus, as in the circuit of FIG. 4, the current limit value of the current limit circuit of FIG. 5 decreases in a well controlled manner as the temperature increases. This current limit circuit functions in a similar manner to that of FIG. 4.

Figure 6:
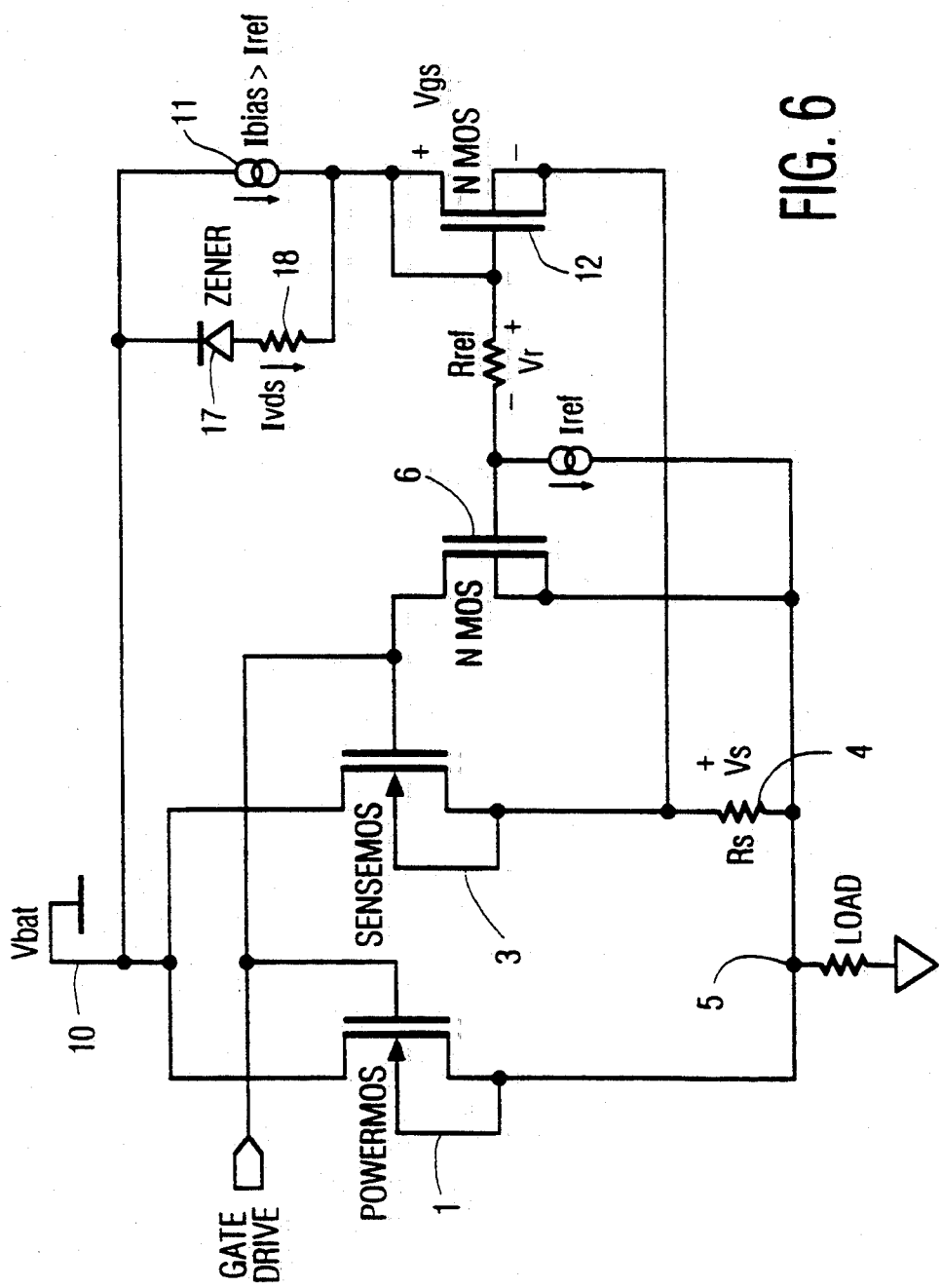
FIG. 6 illustrates a fourth embodiment of the invention which provides a power limiting function.

FIG. 6 shows a variation of the FIG. 2 circuit which provides a power limit function. The circuit is similar to the circuit of FIG. 2 except that a series circuit consisting of a zener diode 17 and a current limiting resistor 18 are connected in parallel with the bias current source 11.

In this circuit, the power limiting function is implemented by decreasing the current limit value when the battery voltage at terminal 10 increases. This circuit operates similarly to the circuit of FIG. 2 except that when the battery voltage increases above a given value, the zener diode breaks down so that a current flows through the limit resistor 18 into transistor 12. This additional current flowing into transistor 12 increases as the battery voltage at terminal 10 increases. This in turn causes the gate to source voltage, $V_{gs}(Tr12)$ of transistor 12 to increase as the battery voltage increases.

Looking again at equation (1)

$$V_{gs}(Tr6) = V_s + V_{gs}(Tr12) - V_r$$

The required value of the gate to source voltage of transistor 6, $V_{gs}(Tr6)$, in order for it to pull down the gate of the power MOS transistor 1, and thus to limit the current ($I_p$), is a fixed quantity. Since the gate/source voltage, $V_{gs}(Tr12)$ of transistor 12 now increases with increasing battery voltage, the required value of $V_{gs}(Tr6)$ is reached at a lower value of the sense voltage, $V_s$, across the sense resistor 4. As a result, the current limiting function is activated at a lower current value when the battery voltage is higher. This achieves the desired power limiting function for the circuit of FIG. 6. The foregoing can also be seen from equation (1).

Since $V_{gs}(Tr6)$ and $V_r$ are fixed, if $V_{gs}(Tr12)$ increases with the battery voltage, then $V_s$ must decrease in order to maintain the equality of equation (1).

Finally, it is to be understood that the above-described arrangements are only illustrative of the principles of the present invention. In accordance with these principles, numerous modifications and alternatives may be devised by those skilled in the art without departing from the spirit and scope of the invention. Accordingly, it is intended that the scope of the invention should be limited only by the following claims.

What we claim is:

1. A current limit circuit comprising:
   first and second terminals for supplying an operating voltage to the current limit circuit,
   a power transistor,
   means for connecting said power transistor and a load in series to said first and second terminals,
   a sense transistor and a sense resistor connected in a series circuit with the load to said first and second terminals such that a current flow through the sense resistor is proportional to a current flow through the power transistor,
   a further transistor connected between a control electrode of the power transistor and a point of reference potential,
   a feedback circuit connected between a junction point of the sense transistor and the sense resistor and a control electrode of the further transistor, said feedback circuit including a series connection of a semiconductor device and a reference voltage source providing a reference voltage which together produce a voltage level shift, and
   means for coupling the control electrode of the power transistor and a control electrode of the sense transistor to a signal input terminal of the current limit circuit.

2. A current limit circuit as claimed in claim 1 wherein;
   said further transistor is biased into cut-off below the current limit value set for the power transistor, and
   a voltage drop is developed across the sense resistor proportional to the current flow in the power transistor and which, via the feedback circuit, drives the further transistor into conduction when said voltage drop across the sense resistor equals the reference voltage, thereby to limit any additional current flow through the power transistor.

3. A current limit circuit as claimed in claim 1 wherein said semiconductor device and said reference voltage source of the feedback circuit comprise a diode-connected field effect transistor and a reference resistor, respectively,
   a source of reference current connected to said reference resistor and to one terminal of the load, and
   a bias current source coupled to said first terminal and to a second junction point between the reference resistor and one terminal of the semiconductor device.

4. A current limit circuit as claimed in claim 1 wherein said transistors are field effect transistors, said semiconductor device is a diode-connected field effect transistor, said second terminal is ground, and said point of reference potential is a junction point between the sense resistor and one terminal of the load.

5. A current limit circuit as claimed in claim 1 wherein said further transistor and said semiconductor device each comprise an NMOS field effect transistor, and said further transistor is biased so that the gate/source voltage thereof is lower than the gate/source voltage of the NMOS semiconductor device when the power transistor is operating below a certain current limit value, whereby said further transistor is cut-off, and wherein said further transistor is made to conduct when current through the sense resistor produces a voltage drop thereacross such that $V_s = V_r$, where $V_s$ is the voltage drop across the sense resistor and $V_r$ is the reference voltage.

6. A current limit circuit as claimed in claim 1 wherein said power transistor and said sense transistor are connected in common to the first terminal and their control electrodes are connected in common to said signal input terminal such that the sense transistor carries a current that is a small fraction of the current flow through the power transistor and said sense resistor has a low resistance value.

7. A current limit circuit as claimed in claim 6 wherein said further transistor and said semiconductor device each comprise a field effect transistor with identical threshold voltages.

8. A current limit circuit as claimed in claim 1 wherein said reference voltage source comprises;
a reference resistor connected between the semiconductor device and the control electrode of the further transistor, and an inversely temperature-dependent current source connected between the reference resistor and one terminal of the load so that said current source supplies a lower current as the temperature increases, whereby the current limit value for the power transistor decreases as the temperature increases.

9. A current limit circuit as claimed in claim 8 wherein said current source comprises a proportional to absolute temperature (PTAT) current source.

10. A current limit circuit as claimed in claim 8 wherein said power transistor and said sense transistor are dimensioned so that the sense transistor carries a current which is a small fraction of the current carried by the power transistor.

11. A current limit circuit as claimed in claim 1 wherein said further transistor and said semiconductor device each comprise a field effect transistor and said reference voltage source comprises a bipolar transistor connected in series with a reference current source between the first and second terminals and with a base of the bipolar transistor connected to the field effect transistor semiconductor device, and with the gate of the field effect further transistor connected to a junction point between the bipolar transistor and the reference current source, whereby a current limit value for the power transistor decreases as the temperature increases.

12. A current limit circuit as claimed in claim 11 wherein said bipolar transistor comprises an NPN transistor and said reference current source is connected between the emitter of the NPN transistor and one terminal of the load which is connected to the sense resistor.

13. A current limit circuit as claimed in claim 1 which provides a power limit function, wherein the semiconductor device comprises a field effect transistor having its gate connected to its drain and its source connected to the sense resistor, said circuit further comprising;
a voltage threshold device connected between the first terminal and the gate of the field effect transistor semiconductor device, said voltage threshold device becoming conductive upon an increase in voltage at said first terminal above a given voltage determined by desired power limit values so that an increased current flows through the field effect transistor semiconductor device so as to increase the gate/source voltage thereof as said first terminal voltage increases, whereby a current limit value is reached with a lower value of sense voltage across the sense resistor thereby to provide said power limit function.

14. A current limit circuit as claimed in claim 13 wherein said voltage threshold device comprises a zener diode in series with a current limit resistor.

15. A current limit circuit as claimed in claim 13 wherein, said reference voltage source comprises a reference resistor and a current source connected in series between the gate of the field effect transistor semiconductor device and one terminal of the load.

16. A current limit circuit as claimed in claim 1 wherein all of the circuit elements are integrated together on a single integrated circuit chip with said further transistor and said semiconductor device located in close proximity to one another.

* * * * *